(12) United States Patent
Montagne et al.

(10) Patent No.: US 7,587,649 B2
(45) Date of Patent: Sep. 8, 2009

(54) TESTING OF RECONFIGURABLE LOGIC AND INTERCONNECT SOURCES

(75) Inventors: Xavier Montagne, Houilles (FR); Franck Maquignon, Nozay (FR)

(73) Assignee: Mentor Graphics Corporation, Wilsonville, OR (US)

( * ) Notice: Subject to any disclaimer, the term of this patent is extended or adjusted under 35 U.S.C. 154(b) by 222 days.

(21) Appl. No.: 10/673,211

(22) Filed: Sep. 30, 2003

(65) Prior Publication Data
US 2005/0071716 A1 Mar. 31, 2005

(51) Int. Cl.
*G01R 31/3183* (2006.01)
*G01R 31/42* (2006.01)

(52) U.S. Cl. .................................... 714/741; 714/724
(58) Field of Classification Search .............. 714/741, 714/726, 717; 716/16
See application file for complete search history.

(56) References Cited

U.S. PATENT DOCUMENTS

| | | | |
|---|---|---|---|
| 5,036,473 A | | 7/1991 | Butts et al. |
| 5,109,353 A | | 4/1992 | Sample et al. |
| 5,278,841 A | * | 1/1994 | Myers ........................ 714/717 |
| 5,436,559 A | * | 7/1995 | Takagi et al. ............. 324/158.1 |
| 5,745,372 A | * | 4/1998 | Fluegge ........................ 716/16 |
| 5,777,489 A | | 7/1998 | Barbier et al. |
| 5,821,773 A | | 10/1998 | Norman et al. |
| 5,903,744 A | * | 5/1999 | Tseng et al. .................. 716/16 |
| 6,141,334 A | * | 10/2000 | Flanagan et al. ............ 370/342 |
| 6,184,707 B1 | | 2/2001 | Norman et al. |
| 6,265,894 B1 | | 7/2001 | Reblewski et al. |
| 6,470,485 B1 | * | 10/2002 | Cote et al. ..................... 716/16 |
| 6,473,726 B1 | | 10/2002 | Reblewski |
| 6,621,767 B1 | * | 9/2003 | Kattan ........................ 368/113 |
| 6,760,277 B1 | * | 7/2004 | Farooq ........................ 368/155 |
| 6,874,107 B2 | * | 3/2005 | Lesea ......................... 714/725 |
| 6,996,758 B1 | * | 2/2006 | Herron et al. ............... 714/726 |

FOREIGN PATENT DOCUMENTS

| | | |
|---|---|---|
| EP | 0 651 343 | 5/1995 |
| WO | WO 94/06210 | 3/1994 |

OTHER PUBLICATIONS

Harris et al., Testing and Diagnosis of Interconnect Faults in Cluster-based FPGA Architectures, IEEE Transactions on Computer-Aided Design of Integrated Circuits and Systems, vol. 21, Issue 11, Nov. 2002, pp. 1337-1343.*

(Continued)

*Primary Examiner*—Cynthia Britt
*Assistant Examiner*—Dipakkumar Gandhi
(74) *Attorney, Agent, or Firm*—Banner & Witcoff, Ltd.

(57) ABSTRACT

Methods and systems for verifying the proper function of reconfigurable logic elements and reconfigurable interconnects are disclosed. Reconfigurable logic elements in an emulation integrated circuit are arranged such that one set of reconfigurable logic elements is used to test a second set of reconfigurable logic elements. After completion of the test of the second set of reconfigurable logic elements, the roles of the first and seconds sets are reversed and the second set of reconfigurable logic elements is used to test the first set. Reconfigurable interconnects are tested by appropriately pairing the interconnect devices in a mirrored manner during a test.

22 Claims, 15 Drawing Sheets

Emulation System - 100

OTHER PUBLICATIONS

Venkatesan, Modelling Feedback Control Adjustment to Control Output Product Quality, Proceedings of American Control Conference, May 2002, vol. 6, pp. 5049-5053.*

Charles Clos, "A Study of Non-Blocking Switching Networks", The Bell System Technical Journal, Mar. 1953, pp. 406-424.

Werner Erhard et al., "First Steps towards a Reconfigurable Asynchronous System", Friedrich-Schiller University Jena, Department of Computer Science, IEEE International Workshop on Rapid System Prototyping, Jun. 1999, pp. 28-31.

Fatih Kocan et al., "Concurrent D-Algorithm on Reconfigurable Hardware", IEEE 1999, pp. 152-155.

Jack Jean et al., "Dynamic Reconfiguration to Support Concurrent Applications", IEEE Transactions Of Computers, vol. 48, No. 6, Jun. 1999, pp. 591-602.

Bernard Bosi, et al., "Reconfigurable Pipelined 2-D Convolvers for Fast Digital Signal Processing", IEEE Transactions on Very Large Scale Integration (VLSI) Systems. vol. 7, No. 3, Sep. 1999, pp. 299-308.

A. Ejnioui et al., "Design Partitioning on Single-Chip Emulation Systems", Center for Microelectronics Research, Dept. of CSE, University of South Florida, 13$^{th}$ International Conference on VLSI Design, 2000, pp. 234-239.

Greg Snider, "The Teramac Compiler", Hewlett-Packard, 1996, pp. 1-51.

Xilinix, "Programmable Gate Array Design Handbook", First Edition, 1986, pp. i-A10.

Jonathan Babb, et al., "Logic Emulation with Virtual Wires", IEEE Transactions on Computer-Aided Design of Integrated Circuits and Systems, Jun. 1997, pp. 1-20.

* cited by examiner

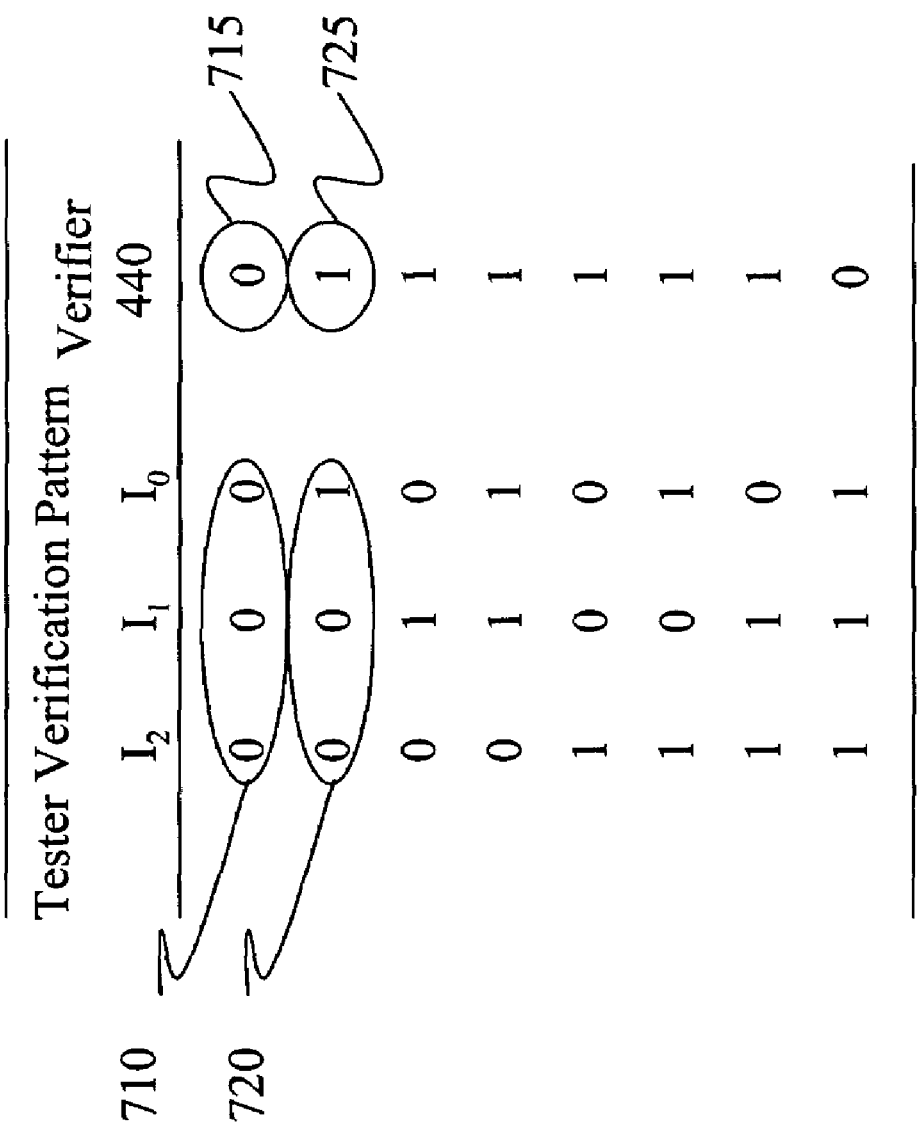

Figure 11B

| Input RP1 | Output RP1 |
|---|---|
| 1112  A | B |
| 1114  B | C |
| 1116  C | A |
| 1118  D | D |

Figure 11C

| Input RP2 | Output RP2 |
|---|---|
| 1122  A | C |
| 1124  B | A |
| 1126  C | B |
| 1128  D | D |

TESTING OF RECONFIGURABLE LOGIC AND INTERCONNECT SOURCES

FIELD OF THE INVENTION

Aspects of the present invention are directed generally to the field of integrated circuits. More specifically, the present invention relates to testing of reconfigurable logic and interconnect resources used in an emulation system.

BACKGROUND OF THE INVENTION

Emulation systems typically were formed using emulation integrated circuits, including programmable logic devices (PLDs), such as general-purpose field programmable gate arrays (FPGAs), without integrating debugging facilities. To emulate a design on such an emulation system, the design would be "realized" by compiling a formal description of the design, partitioning the design into subsets, mapping various subsets to the logic elements (LEs) of the emulation integrated circuits of various logic boards of the emulations system, and then configuring various interconnects to interconnect the logic elements. The partitioning and mapping operations typically would be performed on workstations that were part of or complementary to the emulation systems, while the configuration information would be downloaded onto the logic boards hosting the emulation integrated circuits, and then onto the emulation integrated circuits.

There are various times in the operation of an emulation system, like many other systems, when it is desirable to test the circuitry of the emulation system to ensure it is functioning properly. For instance, when a system is first powered on, a series of tests are performed on the components of the system. Traditionally, as a microcontroller is first powered on, it will be directed to a location in its memory map where code is stored in read only memory (ROM). This code will typically cause the microcontroller to perform tests on itself and other components in the system containing the microcontroller to ascertain if the system is functioning properly.

In the case of an emulator, if the logic used to emulate a design is itself faulty, a user of the emulation system may be led astray by such faulty logic. The user may be falsely led to believe that the design is working properly. The user may also be falsely led to believe that a failure of a design to perform as expected in the emulator is due to a design failure of the design under verification. That is, when there is faulty emulation circuitry, the design may be proper while the faulty emulation logic causes the undesired results from the emulation. Accordingly, when an emulation system is powered on, the emulation system may perform a series of self-tests to ensure that at least the emulation system is working properly.

Later generations of emulation systems have employed emulation integrated circuits with increased density of reconfigurable logic and interconnects, which in turn, have increased the amount of time required to perform these self-tests. Commonly, self-testing involves processes similar to operation during emulation, as described above. In order to self-test components, such as reconfigurable interconnect integrated circuits, or a reconfigurable interconnect portion of an integrated circuit, a series of self-test stimuli are generated, and transferred to various logic boards for input into the integrated circuits. Each of the series of self-test stimuli tests a particular component or sub-component of the emulation system. Expected results from the self-test stimuli are compared with actual results from the self-test stimuli. That is, if even a single switch in a switching matrix is not functioning properly, the actual result from the self-test stimuli would vary from the expected result from the self-test stimuli.

Various problems can also occur with the reconfigurable interconnects. These problems include manufacturing and design defects that result in the cross-influence of signal lines in a device. Thus, due to an unintended short or gap that occurs in the device, one line in a reconfigurable interconnect device may influence another line to cause an erroneous value to appear on that other line. As the systems become more complex, the time associated with testing steps can greatly increase. These testing steps may result in systems requiring tens of minutes to hours to complete a self-test session. Only after self-testing is complete could actual design emulation begin. Any reduction in the amount of time in the design cycle is desirable. Moreover, an improved approach to testing reconfigurable devices to facilitate a series of self-tests is desired to avoid misidentified failures, which are costly to a design cycle.

SUMMARY OF THE INVENTION

There is therefore a need for an emulation system that can provide for distributed processing resources to locally test configurable logic blocks. The distributed processing resources may be instructed by one or more commands to configure a first set of configurable logic blocks to operate as testing circuitry for a second set of configurable logic blocks. Upon completion of testing of the second set of configurable logic blocks, the second set of configurable logic blocks may be configured to operate as testing circuitry for the first (or another) set of configurable logic blocks. According to one aspect of the present invention, the group of configurable logic blocks in the first set may be configured to operate as an input generator to input data patterns into the second set of configurable logic blocks. The first set of configurable logic blocks may further be configured to verify a deterministic output from the second set of configurable logic blocks and/or verify that the input generator outputs a certain number of outputs.

According to another aspect of the present invention, a first routing portion is configured to output data in a first configuration, and a second routing portion, operatively connected to the first routing portion is configured to output data in a second configuration that is inverse to the first configuration. The verification of the first and second routing portions is performed by determining the properties associated with configuring the first routing portion with an input to output mapping function, $f$ and configuring the second routing portion with the inverse of that function, $f^{-1}$. Stated another way, if the first routing portion is configured using the configuration bits of matrix M, then the second routing portion is configured using the configuration bits of matrix $M^{-1}$, where $(M) \cdot (M^{-1}) = I$, I being the identity matrix.

Another aspect of the present invention provides for testing of configurable logic blocks in an emulation system. A first set of configurable logic blocks may be configured to be testing circuitry and to test a second set of configurable logic blocks. The second set of configurable logic blocks may then figured to be testing circuitry to test the first set of configurable logic blocks. Multiple sets of configurable logic blocks can be tested concurrently.

These and other features of the invention will be apparent upon consideration of the following detailed description of illustrative embodiments.

BRIEF DESCRIPTION OF THE DRAWINGS

The foregoing summary of the invention, as well as the following detailed description of illustrative embodiments, is better understood when read in conjunction with the accompanying drawings, which are included by way of example, and not by way of limitation with regard to the claimed invention.

FIG. 7 illustrates an example diagram of the configured response of a verifier for different input values in accordance with at least one aspect of an illustrative embodiment of the present invention;

FIGS. 11A-11C illustrate configuration of two routing portions by mirroring the two portions in accordance with at least one aspect of an illustrative embodiment of the present invention;

DETAILED DESCRIPTION OF ILLUSTRATIVE EMBODIMENTS

In the following description of various illustrative embodiments, reference is made to the accompanying drawings, which form a part hereof, and in which are shown by way of illustration various embodiments in which the invention may be practiced. It is to be understood that other embodiments may be utilized and structural and functional modifications may be made without departing from the scope of the present invention.

Figure 1:
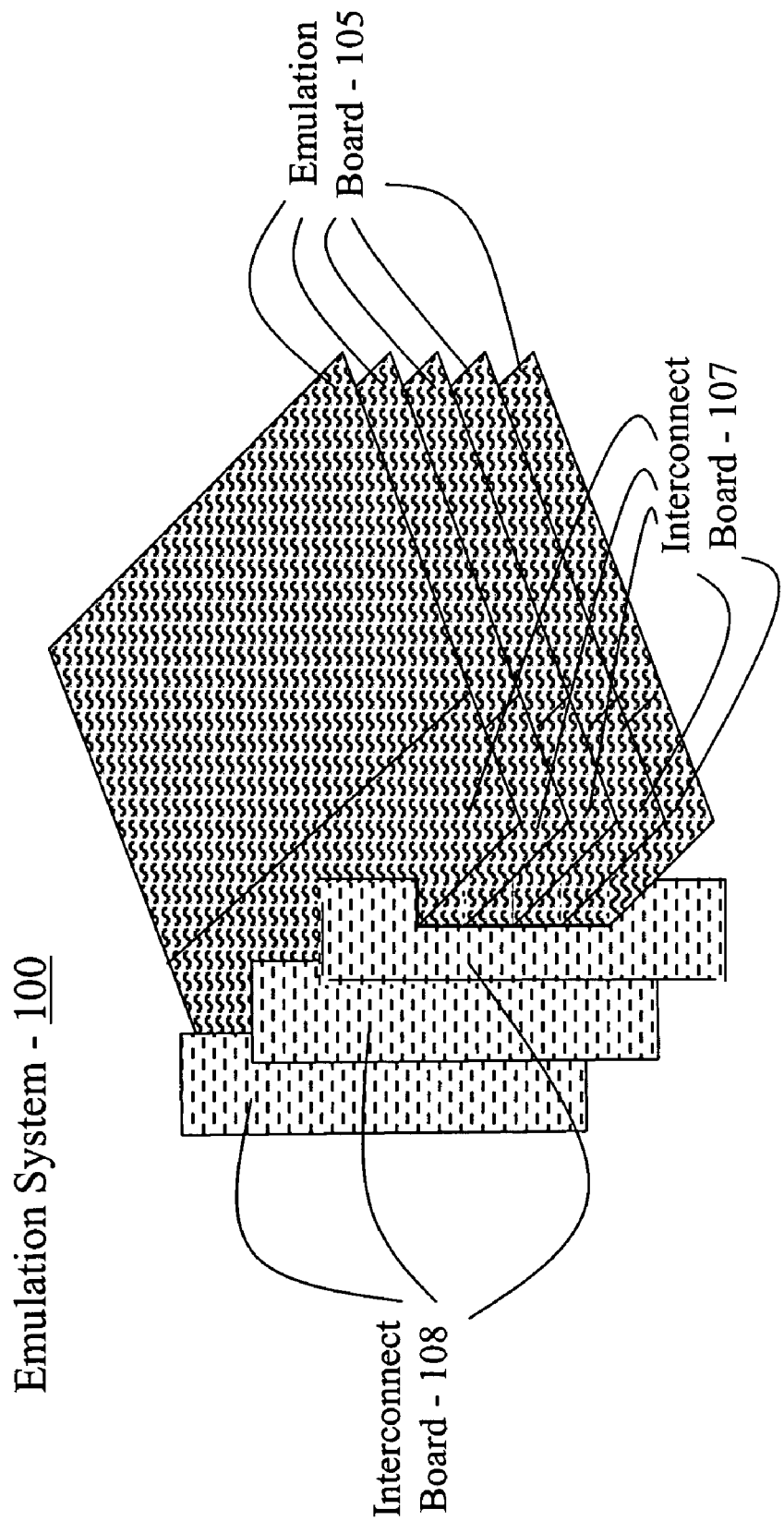
FIG. 1 illustrates an arrangement of logic boards in accordance with at least one aspect of an illustrative embodiment of the present invention.

Illustrated in FIG. 1 is an example of an arrangement for an emulation system 100. The term "emulation" is used broadly herein and includes not only pure hardware emulation, but also the combination of hardware emulation and software simulation, as well as hardware acceleration and/or co-simulation. The emulation system 100 may include one or more emulation boards 105 coupled to each other via one or more interconnect boards 107 and 108 and control resources, wherein data processing resources of the various emulation boards 105 may be employed to perform a number of emulation functions on behalf of and at the direction of the control resources. Interconnect boards 107 and 108 may include various interconnect resources, such as but not limited to interconnect integrated circuits. The emulation boards 105 may include various resources, such as, but not limited to, on-board emulation integrated circuits. The emulation boards 105 may further include interconnect resources.

Figure 2:
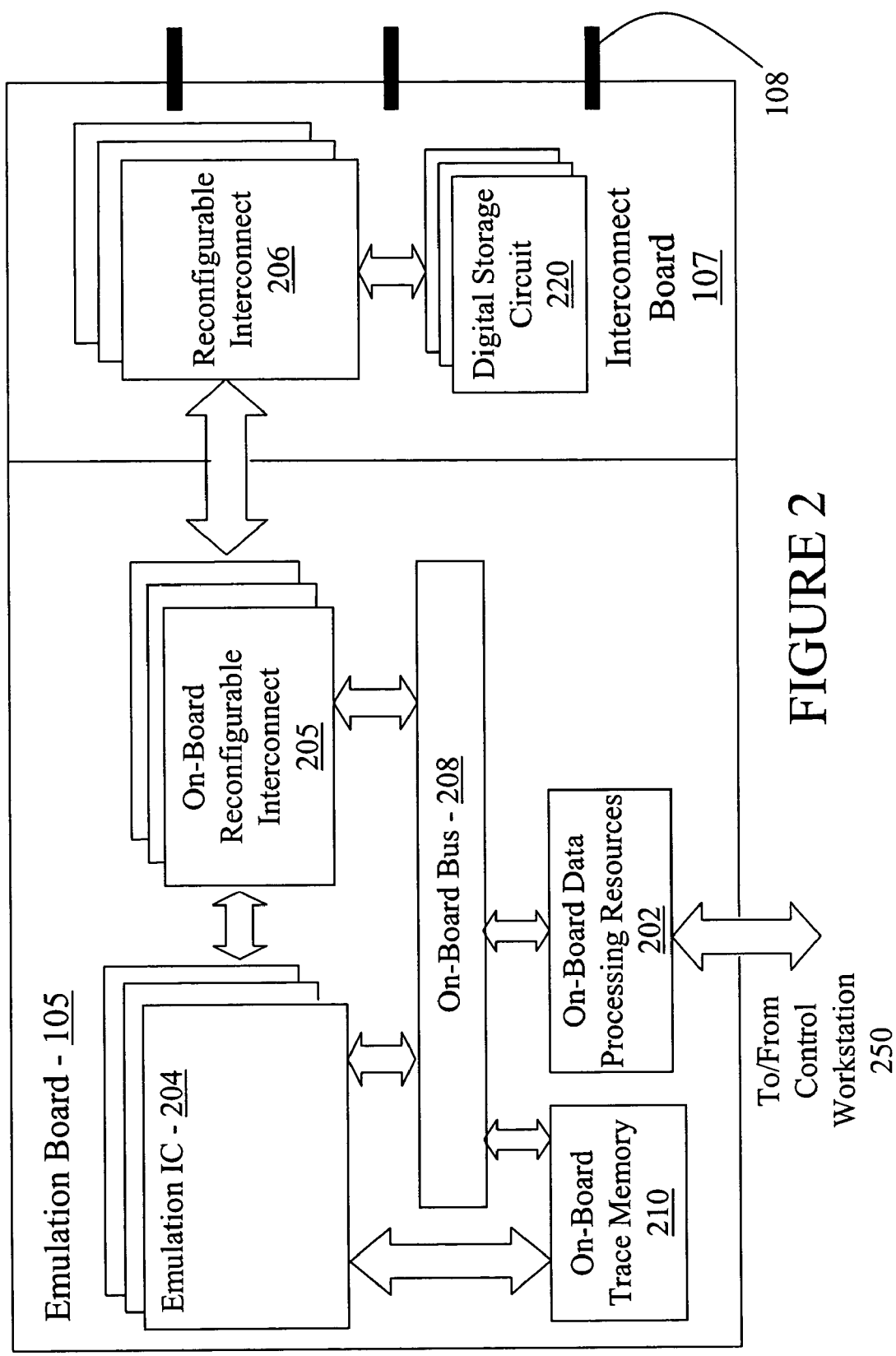
FIG. 2 illustrates an overview of an emulation system in accordance with at least one aspect of an illustrative embodiment of the present invention.

Referring to FIG. 2, for the illustrated embodiment, emulation board 105 includes on-board data processing resources 202, on-board emulation ICs 204, on-board reconfigurable interconnects 205, and on-board bus 208, and on-board trace memory 210 coupled to each other as shown (e.g., through on-board bus 208). Additionally, on-board emulation ICs 204 may also be directly coupled to on-board trace memory 210. Emulation board 105 may further include a number of I/O pins (not shown). A first subset of pins may be employed to couple selected ones of the outputs of on-board reconfigurable interconnects 205 to reconfigurable interconnects 206 of interconnect board 107, which in turn, may be coupled to interconnect boards 108, thereby coupling the emulation resources of a number of logic boards. A second subset of pins may be employed to couple data processing resources 202 to one or more control resources, such as a control workstation 250.

Interconnect boards 107 may include one or more reconfigurable interconnects 206 coupled to a number of digital storage circuits 220. The reconfigurable interconnects 206 may be coupled to reconfigurable interconnects (not shown) included on the interconnect boards 108. The reconfigurable interconnects included on the interconnect boards 108 may also be coupled to digital storage circuits of the type shown on interconnect boards 107. For ease of understanding, references will be made to a single reconfigurable interconnect 206 and a single digital storage circuit 220. However, as previously described, it should be appreciated by those skilled in the art that any number of reconfigurable interconnects 206 and digital storage circuits may be used. On-board bus 208 and on-board trace memory 210 may perform their conventional functions of facilitating on-board communication/data transfers, and collection of signal states of the various emulation signals of the assigned partition of the integrated circuit design being emulated. On-board data processing resources 202 distributively and correspondingly perform emulation functions responsive to testing and/or monitor requests from the control resources of the emulation system.

Digital storage circuit 220 may include a shift register, where information, such as bits representing 1's and 0's are stored and shifted. Such shifting may occur in response to a control signal, or may occur automatically according to a predetermined scheme. In one embodiment, the reconfigurable interconnect 206 may be a switching matrix for programmatically connecting n inputs to m outputs, such as, but not limited to, a crossbar switch. One embodiment may include a square switching matrix with a number of inputs n equal to a number of outputs m. Other embodiments may include a number of inputs n being different from a number of outputs m. Some or all of the total number of inputs n or outputs m may be configured and/or utilized in accordance with aspects of the invention. Accordingly, an emulation system may be formed using multiple ones of interconnect boards 107 and 108, wherein digital storage circuits 220 may be employed to configure and/or test reconfigurable interconnects 206.

Figure 3:
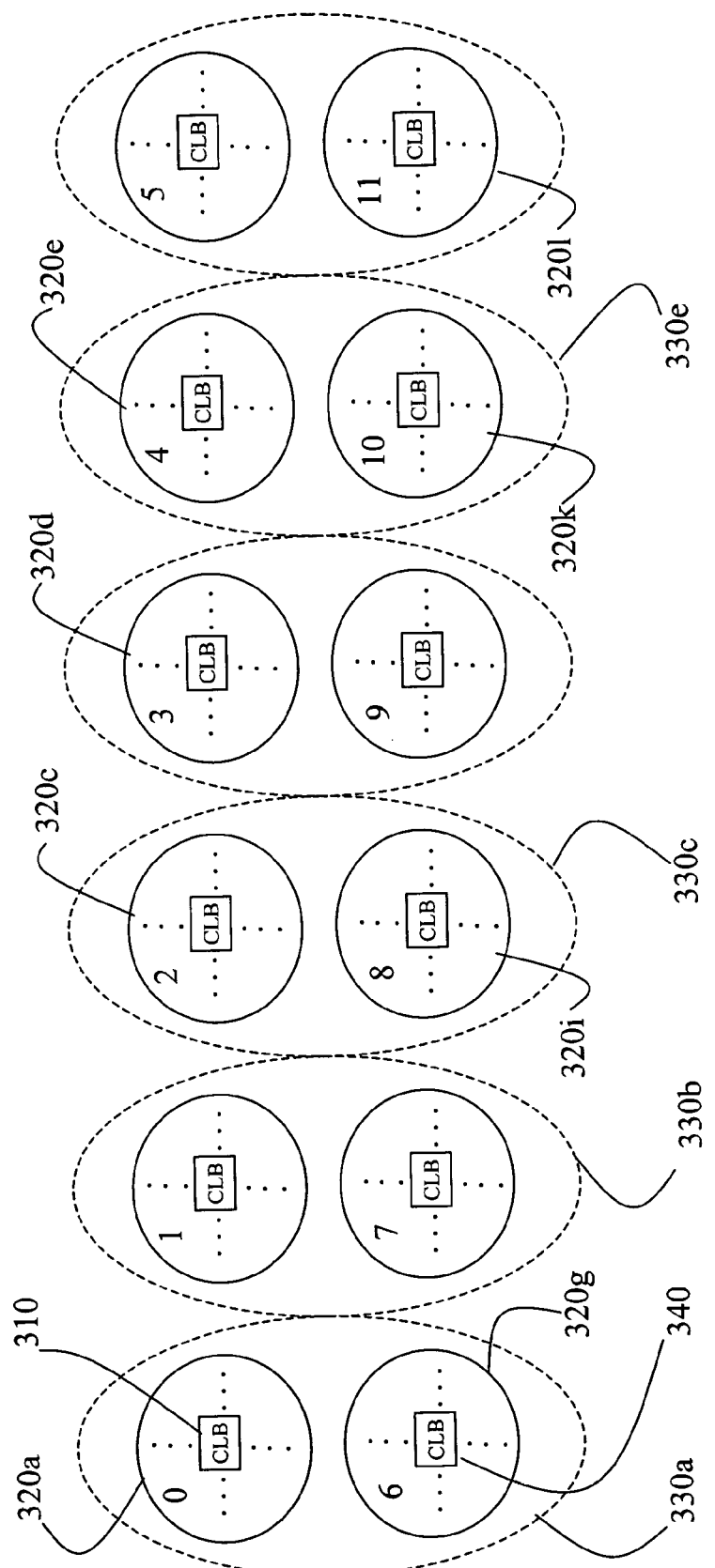
FIG. 3 illustrates an arrangement of clusters of configurable logic blocks in accordance with at least one aspect of an illustrative embodiment of the present invention.

FIG. 3 illustrates an arrangement of clusters of configurable logic blocks in accordance with at least one aspect of an illustrative embodiment of the present invention. Configurable logic blocks include reconfigurable logic elements. The configurable logic blocks may be arranged within an integrated circuit, such as emulation integrated circuit 204. FIG. 3 illustrates an arrangement of 12 clusters, 320a-320l, that each include a number of configurable logic blocks (CLB). A cluster is defined herein to be one or more configurable logic blocks. The number of configurable logic blocks within a cluster 320 may be any number, such as sixty-four (64) configurable logic blocks. As illustrated, a number from 0 to 11 identifies each cluster 320. Clusters 320a (0) to 320f (5) are paired with clusters 320g (6) to 320l (11). For example, cluster 320a is paired with cluster 320g as shown by the broken-line oval 330a. Cluster 320b is paired with cluster 320h as shown by the broken-line oval 330b.

Configurable logic blocks in one cluster within a pair of clusters may be configured to act as testing circuitry to test the configurable logic blocks of its paired cluster. For example, say that configurable logic blocks 310 in cluster 320a are configured to act as testing circuitry to test the configurable logic blocks 340 in cluster 320g. Configuration circuitry to perform the configuration of configurable logic blocks 310 to act as testing circuitry may originate from a number of sources. In one embodiment, the configuration circuitry is embedded in control logic, such as control logic in emulation integrated circuit 204. Thus, when emulation integrated circuit 204 is powered on during a system start-up, the emulation integrated circuit 204 may perform reconfigurable logic testing without any communication with external resources. In other embodiments, the testing configuration may be loaded from other resources found on the emulation board 105 or from a separate source, such as control workstation 250. It should be understood by those skilled in the art that a number of different sources may provide the testing configuration for configuration of the configurable logic blocks 310.

Upon completion of the testing of configurable logic blocks 340 in cluster 320g, configurable logic blocks 340 may then be configured to act as testing circuitry to test configurable logic blocks 310 within cluster 320a. That is, the role of each cluster within a pair of clusters is reversed in order to ensure that all configurable logic blocks within both clusters are functioning properly. Moreover, multiple sets of configurable logic blocks 340 may be tested concurrently. For instance, configurable logic blocks 310 within clusters 320a (0) to 320f (5) may be configured to test configurable logic blocks 340 within clusters 320g (6) to 320l (11), respectively, in a concurrent manner. Upon completion of the testing of configurable logic blocks 340 within cluster 320g (6) to 320l (11), configurable logic blocks 340 within clusters 320g (6) to 320l (11) may be configured to test configurable logic blocks 320a (0) to 320f (5).

Figure 4:
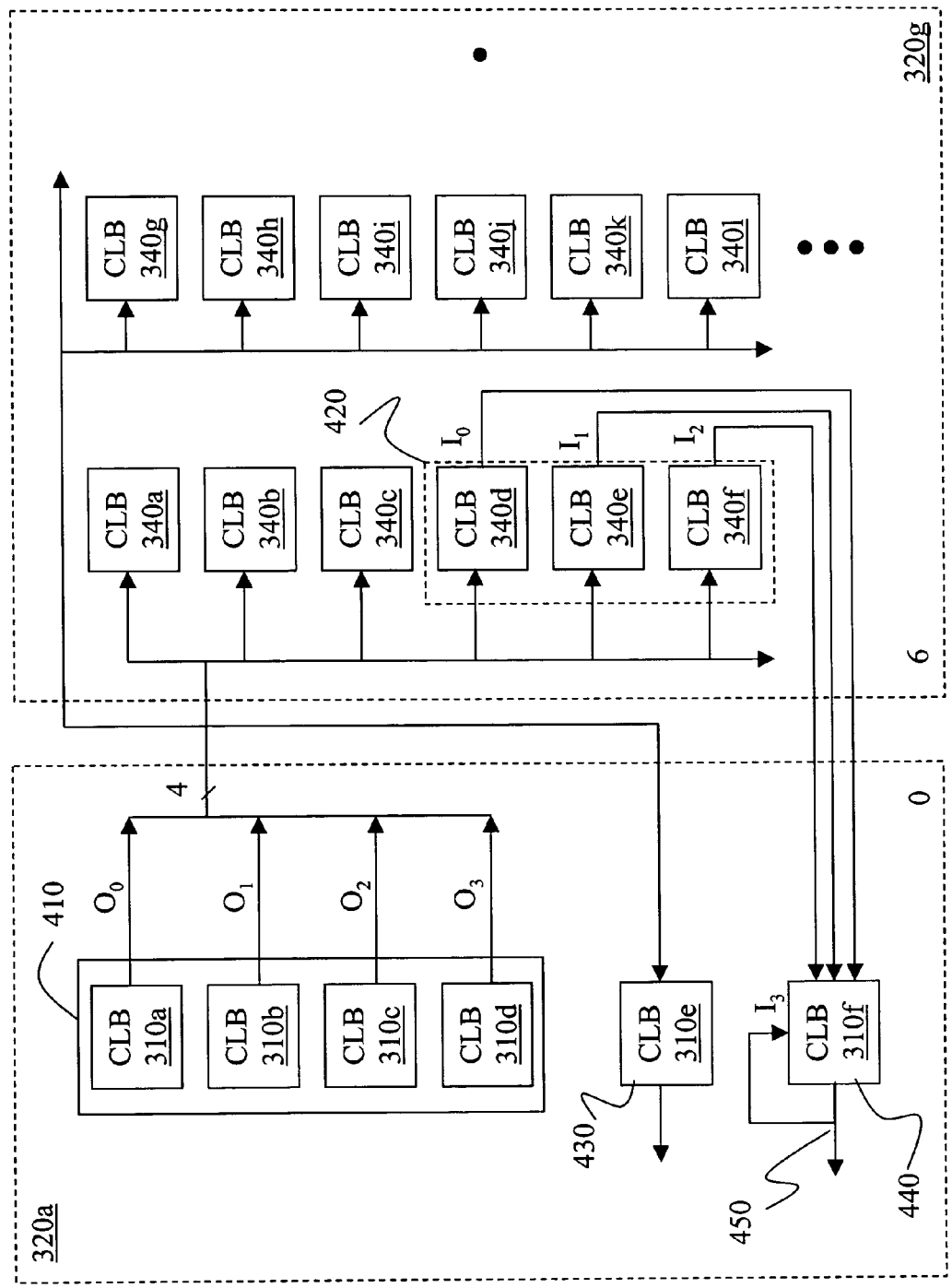
FIG. 4 illustrates a novel arrangement configurable logic blocks to facilitate testing of the configurable logic blocks in accordance with at least one aspect of an illustrative embodiment of the present invention.

FIG. 4 illustrates one embodiment of an example configuration of configurable logic blocks 310 within cluster 320a (0) to test configurable logic blocks 340 within cluster 320g (6). In this embodiment, four configurable logic blocks, 310a-310d, are configured to operate together as a four bit input generator 410. Input generator 410 may include any number, $N \geq 1$, of configurable logic blocks, each outputting one bit. This input generator 410 drives a number of groups, such as group 420, designated by the dotted line box, of configurable logic blocks 340 from cluster 320g (6). As shown, the groups 420 of configurable logic blocks 340 include configurable logic blocks with a number of inputs that matches the number of output bits from the input generator 410, such as four (4) shown in FIG. 4. However, the groups 420 may have a number of tested configurable logic blocks 340 with a number of inputs that is less than the number of output bits of the input generator 410. The input generator 410 may count, e.g., from bits "0000" to "1111". A configurable logic block 310e is configured as a counter checker 430. Counter checker 430 is configured to determine when the input generator outputs bits reach a maximum value (in this case, an output of "1111"). Counter checker 430 in this case is configured to output a bit "0" for all inputs except an input of "1111". For an input of "1111", counter checker 430 will output a bit "1", which may be used by the system to indicate that the counter has successfully reached the maximum value of "1111". It should be understood by those skilled in the art that the checker circuit may be designed so that its output is always a bit "1" for all inputs except an input of "1111" or that various other configurations may be utilized to ensure that the input generator properly reaches the maximum value or other predetermined value.

In one embodiment, each configurable logic block 340 in the cluster 320g (6) is programmed with a set of values to provide as a deterministic output in response to provided patterns from the input generator 410. As shown in FIG. 4, each configurable logic block 340 within group 420 is driven by the output bits from the input generator 410. As shown, the outputs $I_0$ to $I_2$ from the configurable logic blocks 340d to 340f, respectively, are received at the input to a verifier 440 (configurable logic block 310f). Verifier 440 is a configurable logic block found within cluster 320a (0). Verifier 440 will generate a failure indicator if the inputs received by the verifier 440 are not values expected by the verifier 440 in response to values generated by the input generator 410. Verifier 440 is thus used to determine whether the configurable logic blocks 340d to 340f in group 420 are all functioning properly. In one embodiment, verifier 440 may be programmed with a predetermined pattern to compare with inputs to the verifier 440. If an error is detected by the verifier 440, the output value of the verifier 440 is a bit "1". In all cases in which there is no error detected by the verifier 440, the output may be a bit "0". Multiple output bits from multiple verifiers 440 for different groups 420 may be combined to determine a failure indicator. Again it should be understood by those skilled in the art that the outputs of "1" and "0" are merely illustrative and could be reversed while still operating within the scope of the present invention.

A fourth input, $I_3$, to the four input verifier 440 may be configured to maintain a failure indicator for the output of the verifier 440. Output 450 is looped back as the fourth input to verifier 440. In this example, verifier 440 is programmed with a value, such that, once a failure has been detected by the verifier 440, the output 450 of the verifier 440, being looped back as an input 13 to the verifier 440, will ensure that the verifier 440 will constantly output a failure indicator for the remainder of the testing process. In this embodiment, verifier 440 maintains the fact that an error was detected.

Figure 5:
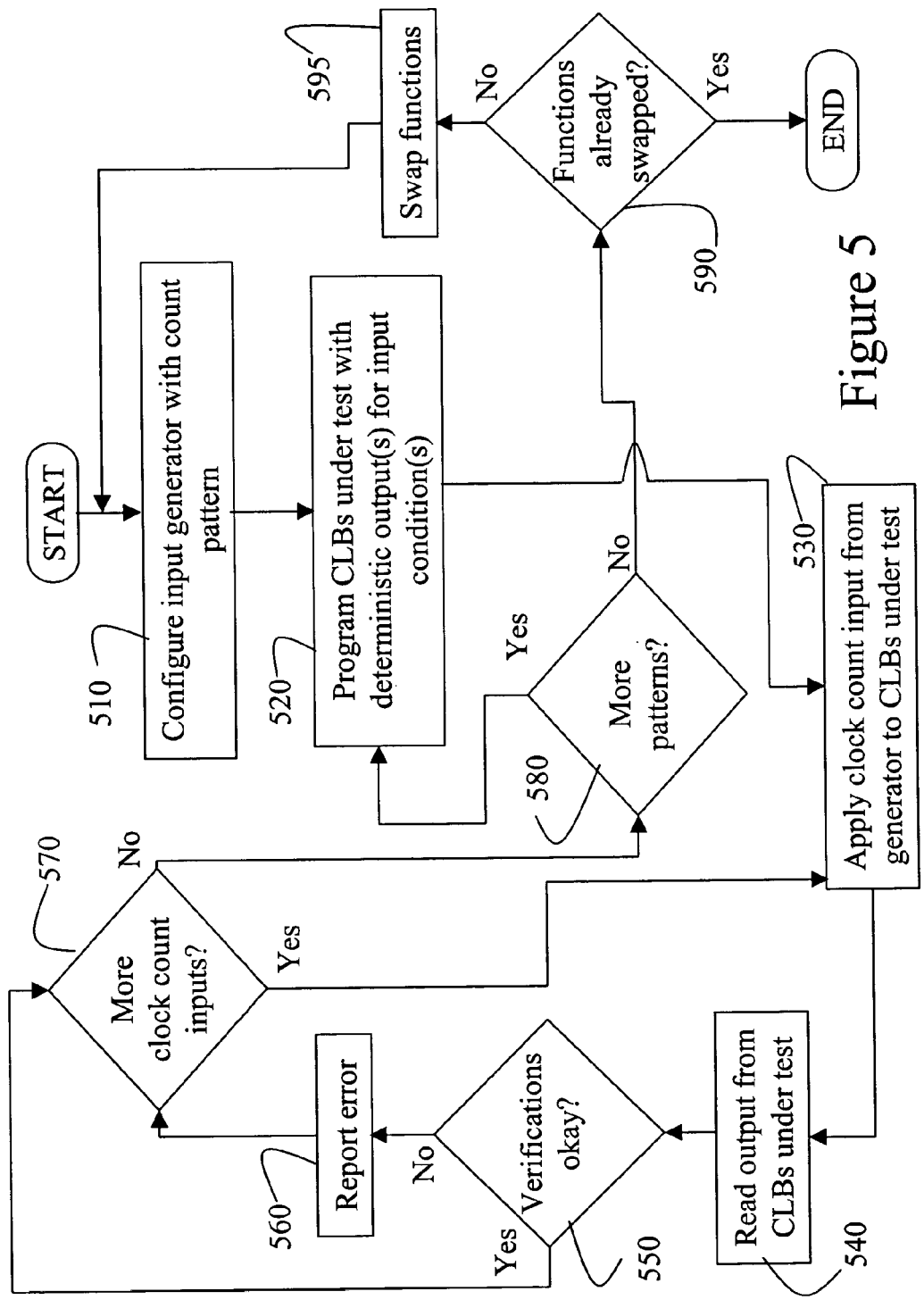
FIG. 5 illustrates operational flow for testing of configurable logic blocks in an emulation system in accordance with at least one aspect of an illustrative embodiment of the present invention.

Referring to FIG. 5, a flow diagram is shown for testing of configurable logic blocks 340 in an emulation system in accordance with at least one aspect of an illustrative embodiment of the present invention. At step 510, an input generator, such as input generator 410, is configured to provide a count from bits "0000" to "1111" to the inputs of each tested configurable logic block, such as configurable logic blocks 340d to 340f within cluster 320g (6). At step 520, configurable logic blocks under test, such as configurable logic blocks 340d to 340f, are programmed with a configuration providing for a deterministic output pattern for each input received from the input generator 410. Step 520 may precede step 510 or may not be needed at all in the instance where the configurable logic blocks under test have been preprogrammed. For the example illustrated in FIGS. 6 to 7, a configuration of 0xAAAA has been programmed into configuration logic blocks 340. Input generator 410 then applies a clock count input to the tested configurable logic blocks at step 530.

Figure 6:
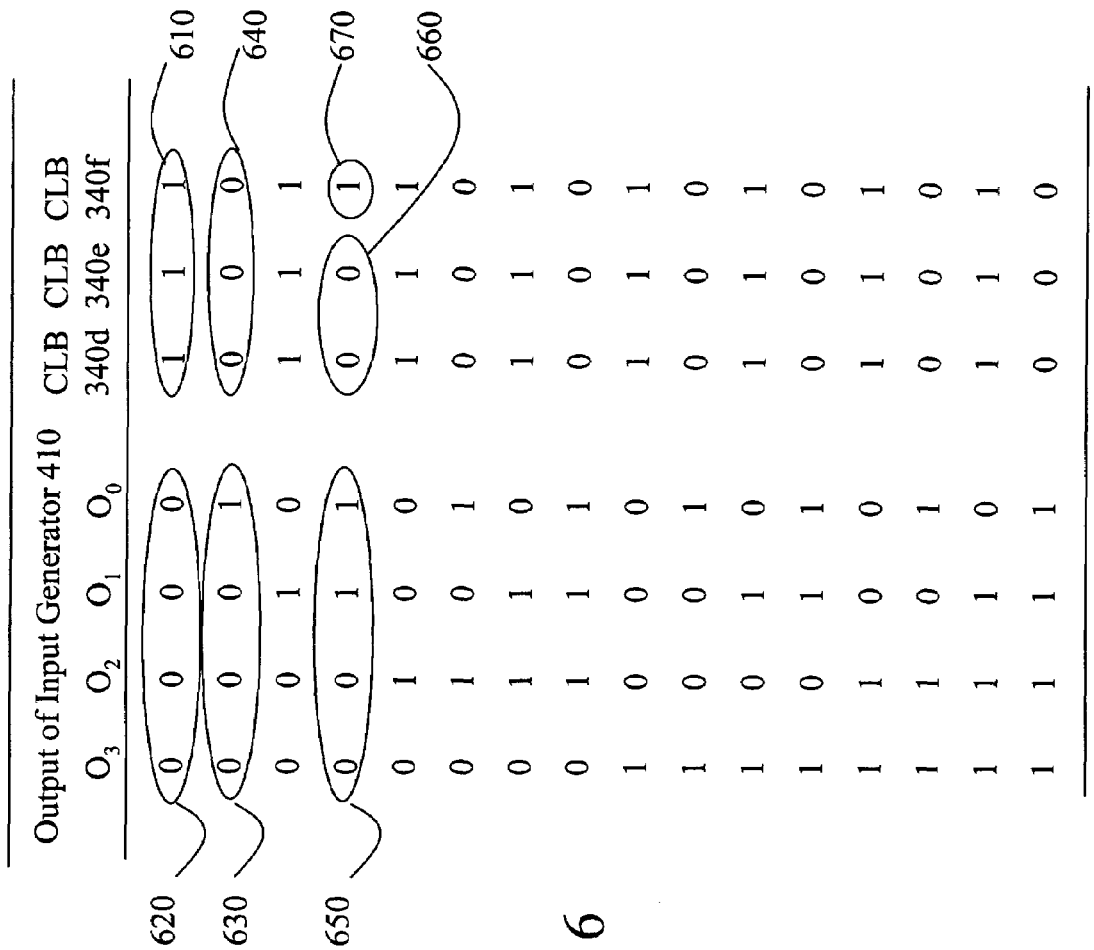
FIG. 6 illustrates an example diagram of the configured responses of a group of tested configurable logic blocks in accordance with at least one aspect of an illustrative embodiment of the present invention.

FIG. 6 illustrates an example diagram of the configured responses of a group 420 of tested configurable logic blocks 340d to 340f in accordance with at least one aspect of the present invention. In the illustrated embodiment, configurable logic blocks 340d to 340f are four input devices each with a single output. The output of each configurable logic block 340d to 340f is responsive to output signals $O_0$ to $O_3$ received from the input generator 410 and the deterministic output pattern programmed in each configurable logic block 340d to 340f. As stated above, for this example, configurable logic blocks 340, including 340d to 340f, have been programmed with a configuration of 0xAAAA, e.g., the output bits are 1, 0, 1, 0, 1, 0, ..., with one bit output per four bit input clock count received. As shown in FIG. 6, configurable logic block 340d, 340e, and 340f output a bit "1" 610 when a clock count input of "0,0,0,0" 620 is received. At the next clock count input of "0,0,0,1" 630, configurable logic blocks 340d, 340e, and 340f each output a bit "0" 640. Because each of the configurable logic blocks 340d, 340e, and 340f have been configured with the same pattern, e.g., 0xAAAA, each configurable logic block should be outputting the same bit value per clock count input received. As will be described more fully below, at the clock count input of "0,0,1,1" 650, configurable logic blocks 340d, 340e, and 340f are each expected to output a bit "0"; however, in the example shown in FIG. 6, configurable logic blocks 340d and 340e each out a bit "0" 660 as expected, but configurable logic block 340f outputs a bit "1" 670.

Referring back to FIG. 5, at step 540, the verifier 440 reads the outputs from the configurable logic blocks under test, such as configurable logic blocks 340d to 340f. By reading the outputs, the clock count is topped to avoid losing the failure detection. At step 550, a determination is made by verifier 440 as to whether the verification of the tested configurable logic blocks was successful. As described above in one embodiment, if the verification was not successful, a bit "1" is outputted from the verifier 440 to report an error, step 560. The process then determines, at step 570, whether more clock count inputs are to be received by the configurable logic blocks under test. If more clock count inputs are to be received, the process begins again at step 530 for a new clock count input. If not, a determination is made at step 580 as to whether more configuration patterns are to be applied to the configurable logic blocks under test, such as configurable logic blocks 340d to 340f. If more patterns, such as 0x0000, 0xFFFF, 0x5555, 0x3333, 0xCCCC, 0x9999, and 0x6666, need to be applied, the process begins again at step 520.

In one embodiment, verifier 440 includes a loopback input in which the output of the verifier 440 is connected to 13 (as illustrated in FIG. 4). Indeed if the loopback input is included then verifier 440 maintains the fact that an error was detected. In this embodiment, the clock counter can continue to run without determining whether an error has been properly detected because verifier 440 maintains the fact that the first error was detected.

FIG. 7 illustrates an example diagram of the configured response of a verifier 440 for different input values in accordance with at least one aspect of an illustrative embodiment of the present invention. As shown in FIG. 7, for a given pattern from input generator 410 each output of the tested configurable logic blocks 340d, 340e, and 340f, is expected to be the same. Thus, for an input received as "0,0,0" 710 from inputs lines $I_2$, $I_1$, and $I_0$, verifier 440 is configured to output a bit "0", as indicated by 715, when the appropriate, e.g., expected, pattern is presented to the verifier 440 inputs. As stated above, verifier 440 will output a bit "1" when a failure is detected. For example, if the output pattern of bits "0,0,1", 660 and 670, is received by the verifier 440, as indicated by 720, from configurable logic blocks 340d, 340e, and 340f, such an input pattern to the verifier 440 would be an unexpected pattern. Thus, verifier 440 would output a bit "1", as indicated by 725, to indicate the detection of a failure.

Referring back to FIG. 5, after determining whether the verification check was successful and reporting an error if it was not, as stated above, a determination is made at step 580 as to whether there are more configuration patterns to be presented to the tested configurable logic blocks, such as configurable logic blocks 340d to 340f. If no more patterns are to be presented, a determination is made at step 590 as to whether the roles of the pair of clusters, such as cluster 320a and 320g, have been swapped. If the roles of the pairs of clusters have previously been swapped, the process is complete. In the event that the roles of the pairs of clusters have not been previously swapped, configurable logic blocks 340 within cluster 320g are configured to be testing circuitry to test the configurable logic blocks 310 in cluster 320a at step 595. The testing process may now be repeated with the roles of the pair of clusters having been swapped. Any type of pattern may be utilized for testing purposes. For example, testing patterns of hexadecimal 0x0000, 0xFFFF, 0x5555, 0xAAAA, 0x3333, 0xCCCC, 0x9999, and 0x6666 may be utilized in order to detect failures, as these patterns are noteworthy for detecting the cross-influence of bit lines, i.e., when a bit line flips and causes a neighboring bit line to flip erroneously.

Similar to the testing of clusters of configurable logic blocks as described above, testing of reconfigurable interconnects, reconfigurable interconnect devices, and interconnect boards is important regarding the cross influence of bit lines. That is, when a signal on one bit line changes is there an unexpected influence on the signals on the neighboring bit lines. Routing portions of reconfigurable interconnects, interconnect boards, and other reconfigurable interconnect devices are designed to facilitate the interconnection of the reconfigurable logic when a design is to be emulated. Types of routing portions that may be tested include switching matrix devices, routing chips, and crossbars.

Figure 8A:
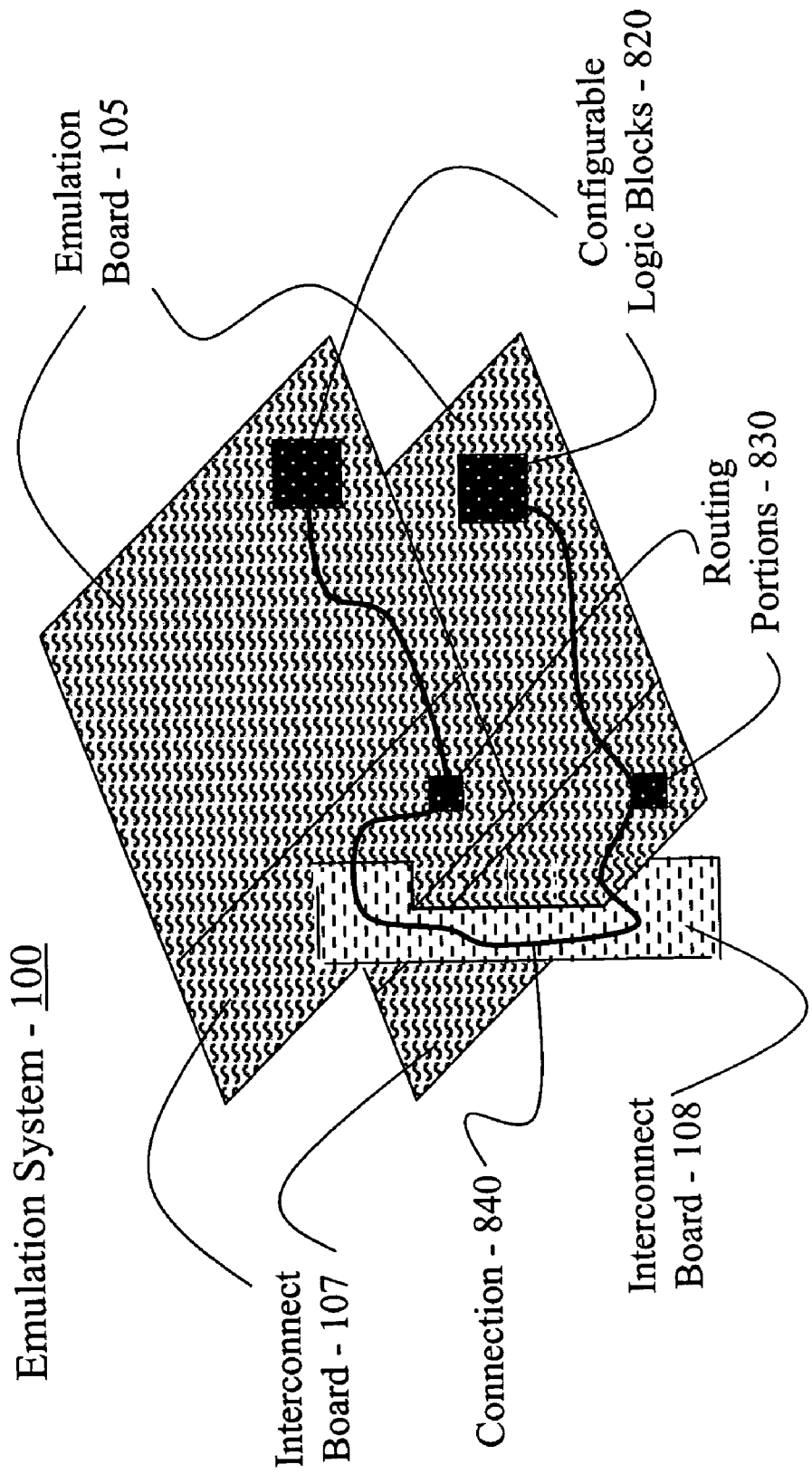
FIGS. 8A-8B illustrate an arrangement of logic boards in accordance with at least one aspect of an illustrative embodiment of the present invention.
Figure 8B:
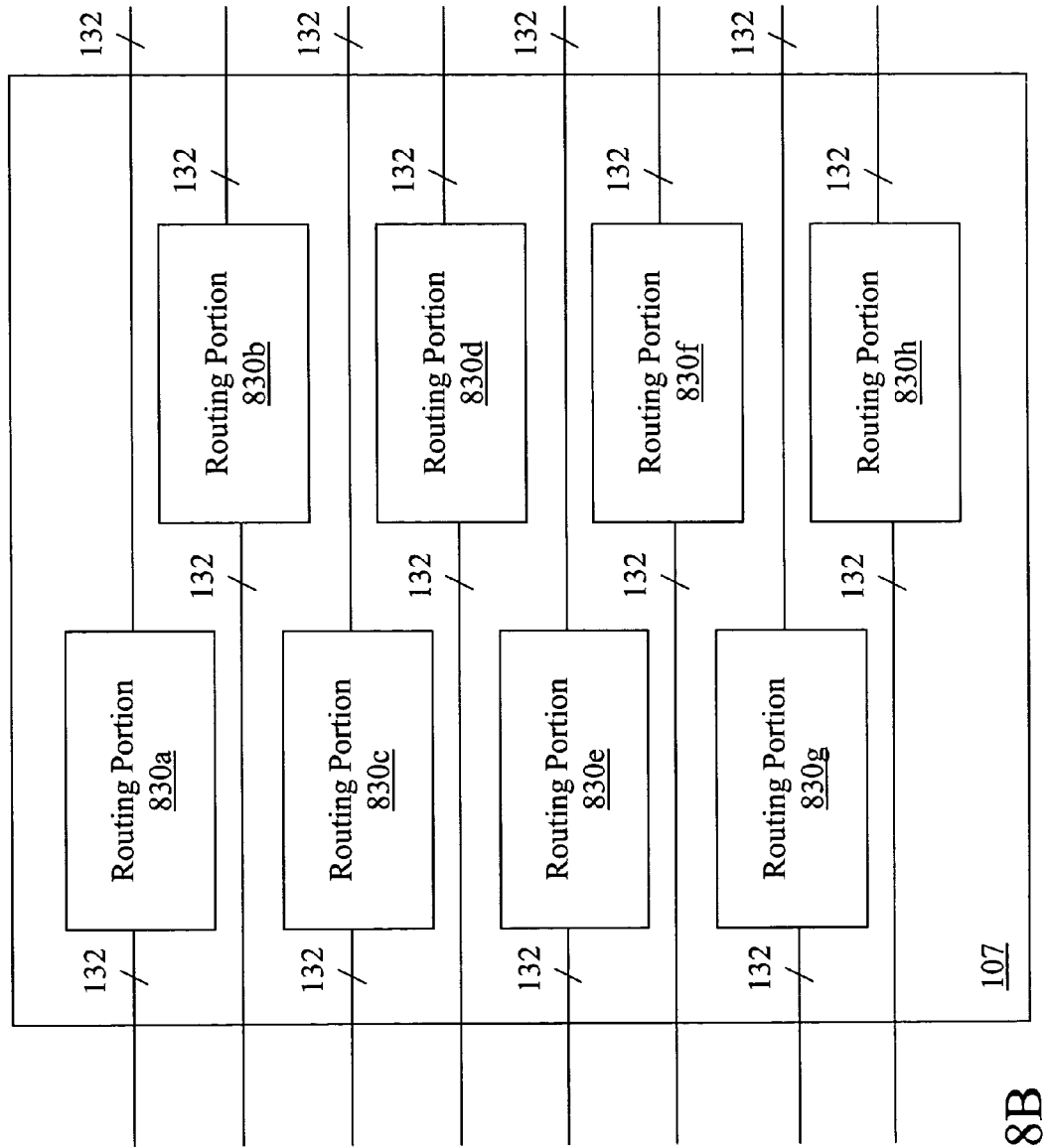

Illustrated in FIGS. 8A-8B is an example of a further arrangement for emulation system 100. As stated above, the emulation system 100 may include one or more emulation boards 105 coupled to each other via one or more interconnect boards 107 and 108 and control resources, wherein data processing resources of the various emulation boards 105 may be employed to perform a number of emulation functions on behalf of and at the direction of the control resources. Interconnect boards 107 and 108 may include various integrated circuits. The emulation boards 105 may include various resources, such as, but not limited to, on-board emulation integrated circuits.

As shown in FIG. 8A, emulation boards 105 include configurable logic blocks (CLBs) 820 that physically reside on different emulation boards 105. Configurable logic blocks 820 on a first emulation board 105 may include configurable logic blocks for testing purposes, such as configurable logic blocks 310. Other configurable logic blocks 820 on a second emulation board 105 may include configurable logic blocks under test, such as configurable logic blocks 340. It should be understood that the methods for testing of configurable logic blocks as illustrate above may be performed in the manner as further described below.

An emulation board 105 may include a number of emulation chips (not shown), where each emulation chip may include a number of CLBs 820. Configurable logic blocks 820 are coupled to each other via a connection 840 and through two routing portions 830. Routing portions 830 physically reside on interconnect boards 107, as illustrated in FIG. 8A. Routing portions 830 could physically reside on other components of the emulation system 100. Interconnect boards 107 and 108 contain various interconnect devices, such as routing portions 830, which perform the mapping of any input to any output of the interconnect device. FIG. 8B illustrates one embodiment of an interconnect board 107. In this embodiment, eight (8) routing portions 830a to 830h, e.g., interconnect devices, are capable of mapping one hundred thirty-two (132) inputs each to any of one hundred thirty-two (132) outputs each. These routing portions 830a to 830h may be capable of routing any input to any output, and so it may be desirable to check that every input can be routed to every output. Thus for an n-input-by-n-output routing portion, $n^2$ configurations may be checked to make sure that every input can be mapped to every output.

Figure 9:
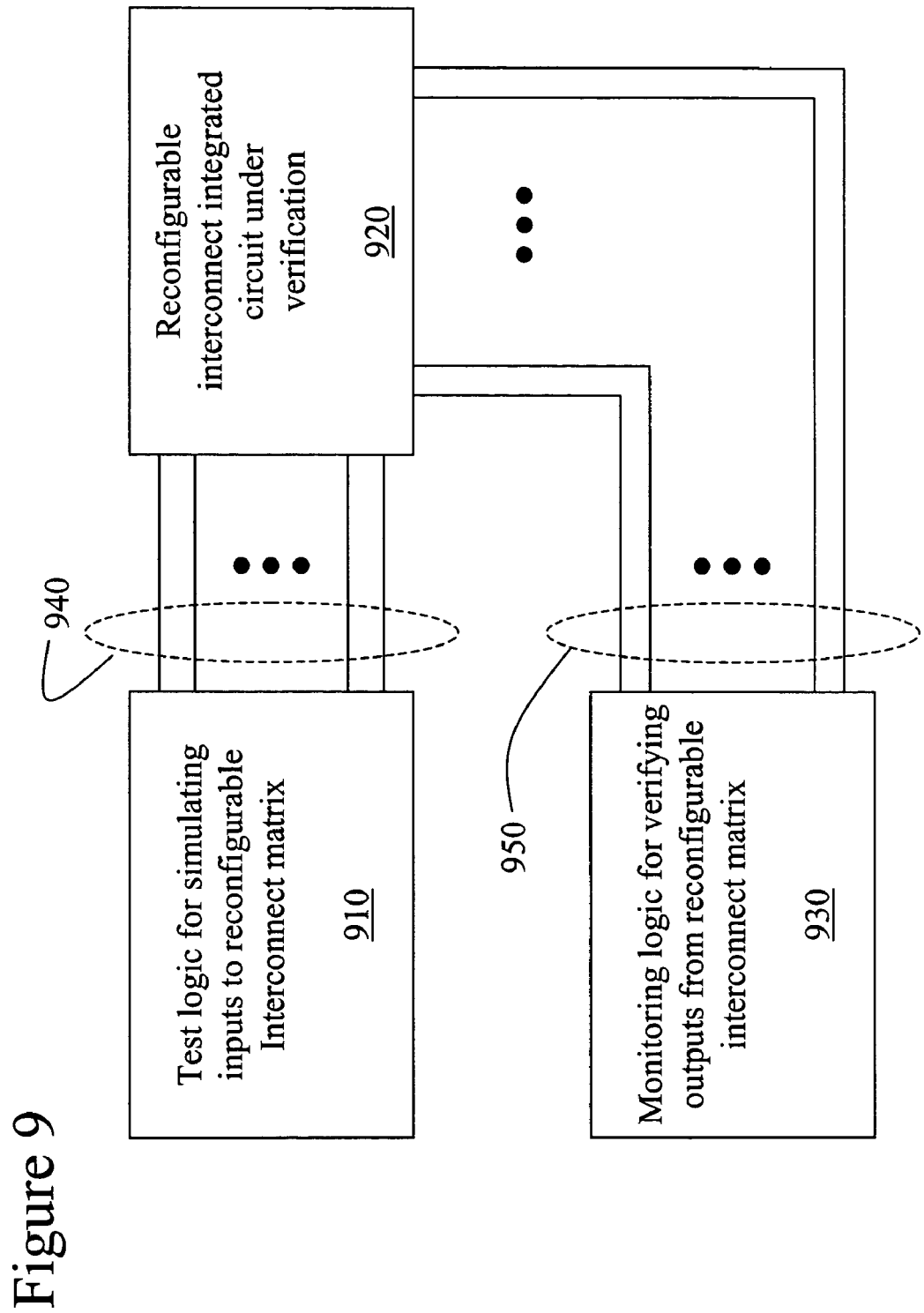
FIG. 9 illustrates a configuration for testing a reconfigurable interconnect integrated circuit under verification.

FIG. 9 illustrates a configuration for testing a reconfigurable interconnect integrated circuit 920 under verification. Testing logic 910 and monitoring logic 930 may correspond to configurable logic blocks 820. In this configuration, testing logic 910 excites inputs 940 to reconfigurable interconnect integrated circuit 920. Monitoring logic 930 monitors outputs 950 from reconfigurable interconnect integrated circuit 920. After each pattern is applied, a different configuration is loaded in the reconfigurable interconnect integrated circuit 920 to allow different configuration testing. Thus, for a given input combination provided to the inputs 940 of the reconfigurable interconnect integrated circuit 920, a different combination of outputs 950 is provided to monitoring logic 930.

Figure 10:
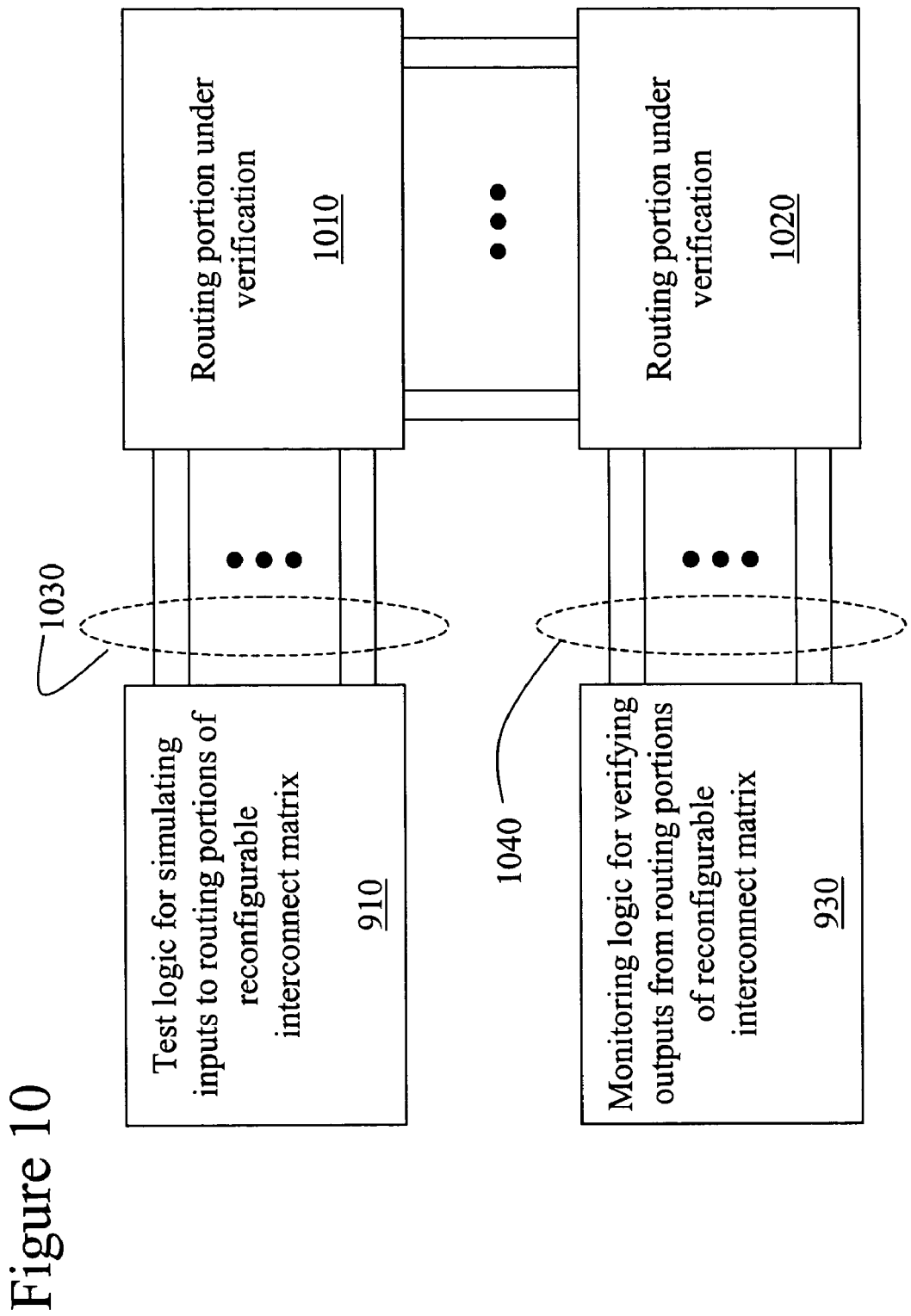
FIG. 10 illustrates a test configuration in accordance with at least one aspect of an illustrative embodiment of the present invention.

FIG. 10 shows a test configuration in accordance with at least one aspect of an illustrative embodiment of the present invention. As shown in FIG. 10, two routing portions under verification, 1010 and 1020, are disposed between testing logic 910 and monitoring logic 930. Testing logic 910 and monitoring logic 930 may correspond to configurable logic blocks 820 and the two routing portions under verification, 1010 and 1020, may correspond to routing portions 830. Configuration of the two routing portions 1010 and 1020 occurs in a mirrored manner, i.e., the configuration of one routing portion 1020 is the inverse of the other routing portion 1010. In this way, by holding constant the coupling of the output pins of the first routing portion 1010 to the input pins of the second routing portion 1020, successive test vectors 1030 applied to the input pins of the first routing portion 1010, will always exit deterministically and invariantly on the same corresponding output pins of the second routing portion 1020, regardless of how mappings of the first and second routing portions 1010 and 1020 are inversely configured to each other.

The output pins 1040 of the second routing portion 1020, over which the values of each test vector will exit, depend only on how the output pins of the first routing portion 1010 are coupled to the input pins of the second routing portion 1020. By configuring the routing portions 1010 and 1020 in this mirrored manner, the checking of successful/correct routing of each test vector at the output pins 1040 of the second routing portion 1020 is simplified. Thus, for each test vector, the test output monitoring logic 930 that monitors the output pins 1040 of the second routing portion 1020 only needs to be programmed with one expected arrival pattern for all mapping configuration pairs of the two routing portions 1010 and 1020. In other words, for each test vector, even though the mappings of the two routing portions may be reconfigured inversely in as many as n×n configurations, test output monitoring logic 930 that monitors the output pins 1040 of the second routing portion 1020 is programmed with only one expected output of the test vector for all n×n mapping configurations of the two routing portions. As those skilled in the art will appreciate, this embodiment represents a substantial potential saving in the testing time of the routing portions.

Figure 11A:
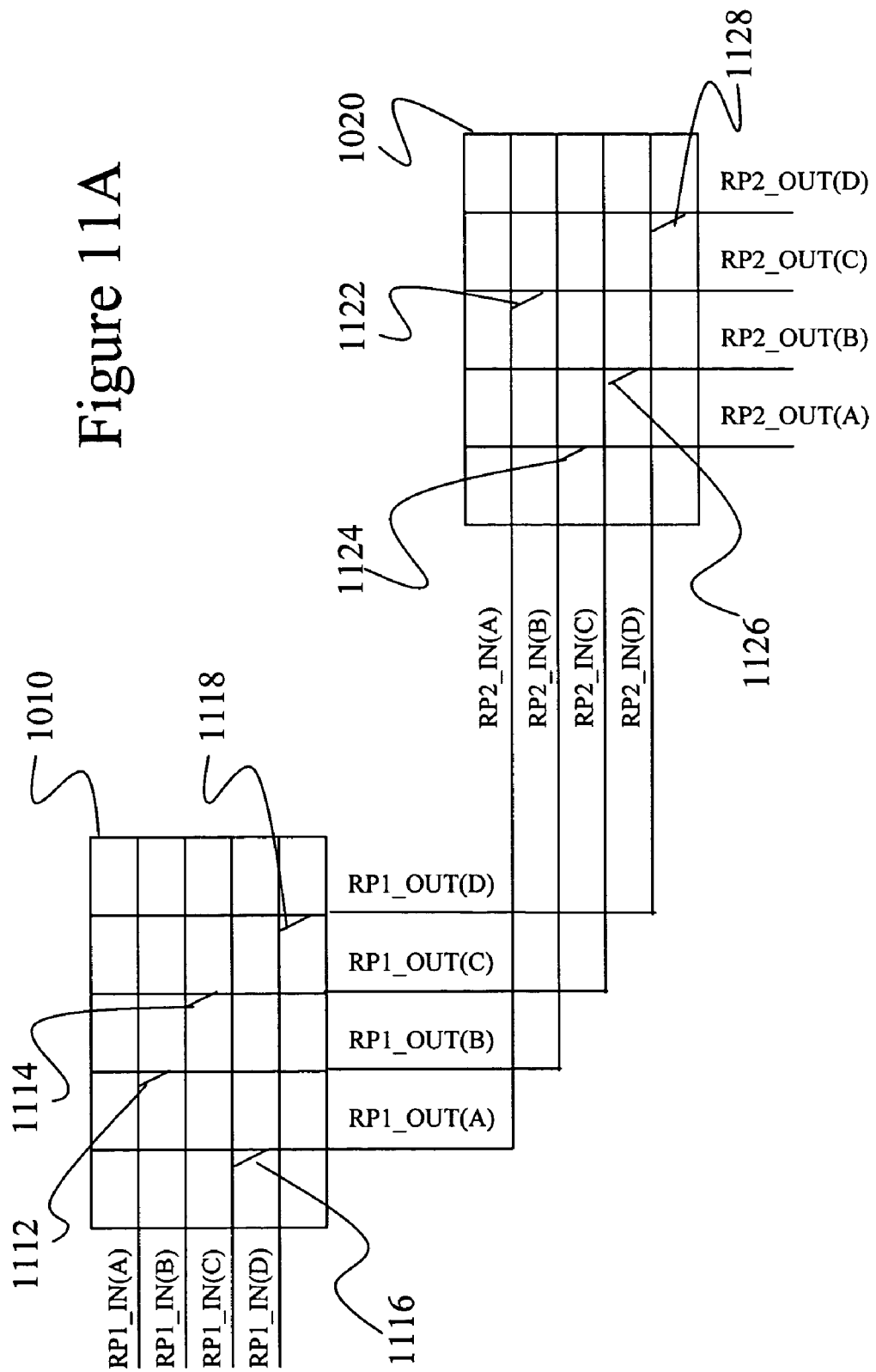

FIGS. 11A to 11C illustrate an embodiment of the configuration of two routing portions 1010 and 1020 by mirroring the two portions using a 4-input-by-4-output switching matrix. In this embodiment, the output pins of the first routing portion 1010, RP1_OUT(A) to RP1_OUT(D), are coupled to the input pins of routing portion 1020, RP2_IN(A) to RP2_IN(D), respectively, and held constant. Thus, for each test vector, when the first routing portion 1010 is configured with a particular mapping of inputs to outputs for testing, e.g. the mapping shown in FIG. 11B, where input RP1_IN(A) is mapped via connection 1112 to RP1_OUT(B), RP1_IN(B) is mapped via connection 1114 to RP1_OUT(C), RP1_IN(C) is mapped via connection 1116 to RP1_OUT(A), and RP1_IN(D) is mapped via connection 1118 to RP1_OUT(D).

The second routing portion 1020 is configured to perform the inverse, i.e., mirrored, mapping function of the first routing portion 1010. The mapping function that is required to invert the mapping function of the first routing portion 1010 is shown in the second routing portion 1020 as illustrated in FIG. 11A. As illustrated in the table of FIG. 11C, to be able to have output pins RP2_OUT(A) to RP2_OUT(D) deterministically and invariantly reflect the same values correspondingly applied to input pins RP1_IN(A) to RP1_IN(D), inputs arriving at pins RP2_IN(A), RP2_IN(B), RP2_IN(C), and RP2_IN(D) of the second routing portion 1020 are mapped to RP2_OUT(C) via connection 1122, RP2_OUT(A) via connection 1124, RP2_OUT(B) via connection 1126, and RP2_OUT(D) via connection 1128, respectively, as illustrated in FIGS. 11A and 11C. For example, if the first routing portion 1010 is configured with configuration row vectors of [0 1 0 0], [0 0 1 0], [1 0 0 0], and [0 0 0 1] (the example configuration of FIGS. 11A and 11B), the second routing portion 1020 is configured with the column vectors of [0 1 0 0], [0 0 1 0], [1 0 0 0], and [0 0 0 1] (the example configuration of FIGS. 11A and 11C). The two sets of configuration vectors result in the identity matrix. Accordingly, as described earlier, for each test vector, the test output monitoring logic 920 needs to be programmed with only one corresponding expected output for all n×n possible configurations of the two routing portions 1010 and 1020. The principles shown here for a 4-input-by-4-output switching matrix are applicable to smaller or larger routing portions such as the one hundred thirty-two (132) input to one hundred thirty-two (132) output routing portion 830 shown in FIG. 8B.

In the emulation system 100 shown in FIGS. 8A and 8B, boards with multiple reconfigurable interconnects are shown, and concurrent testing of multiple reconfigurable interconnects may be performed. For example, a first routing portion 1010 can physically reside on one interconnect board 107 while a second routing portion 1020 can physically reside on the same interconnect board 107 or another interconnect board, such as a different interconnect board 107 or interconnect board 108. In this manner, for interconnect board 107 shown in FIG. 8B, eight (8) concurrent tests can occur, one for each of the routing portions 830a to 830h on the interconnect board 107. Additional concurrent tests may occur between multiple boards 105, 107, and 108. For example, in an embodiment with one hundred twenty eight (128) routing portions, sixty-four (64) concurrent pairs of routing portions may be under verification.

Figure 12:
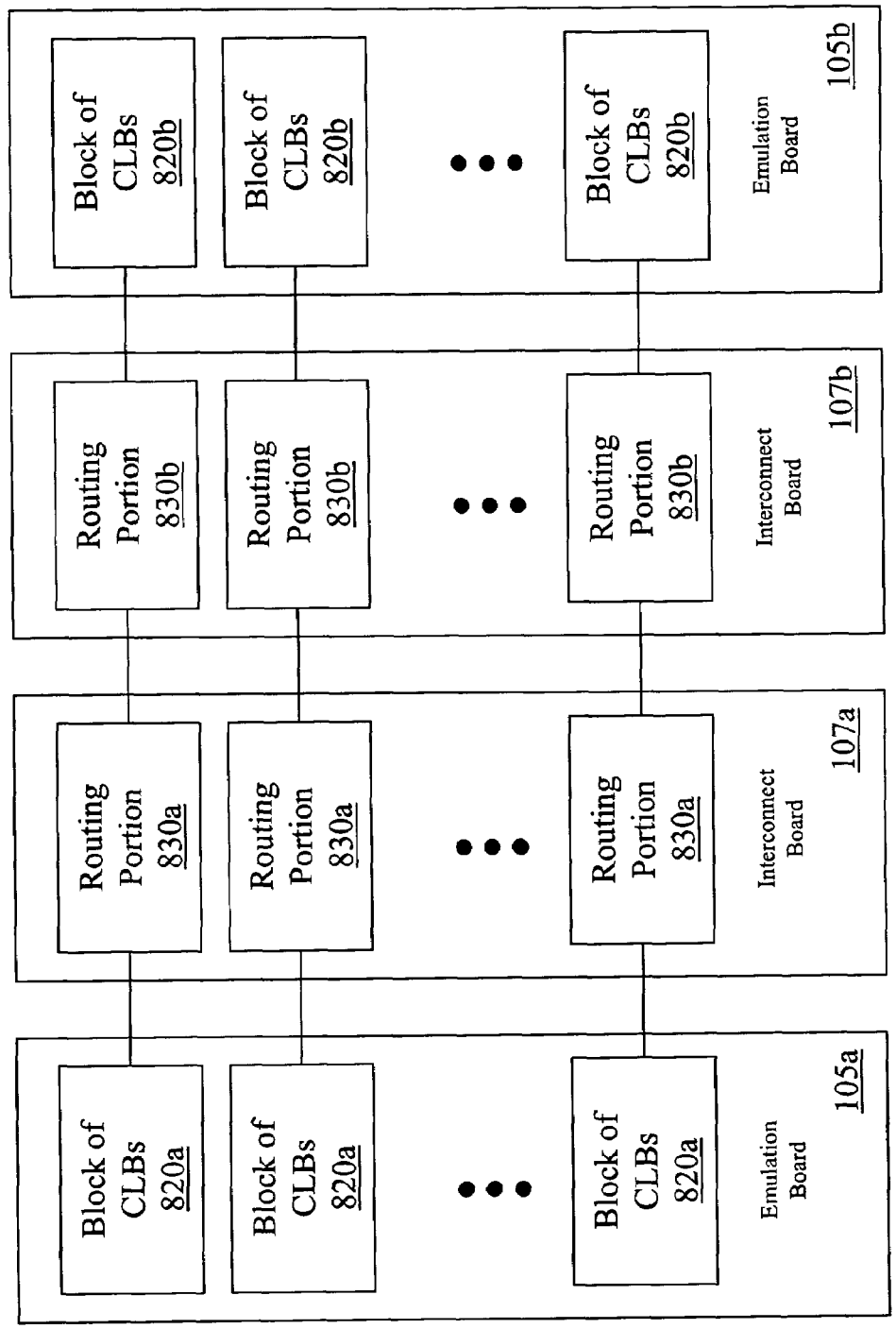
FIG. 12 illustrates one example of concurrent testing in accordance with at least one aspect of an illustrative embodiment of the present invention.

FIG. 12 illustrates one example of concurrent testing in accordance with at least one aspect of an illustrative embodiment of the present invention. One method of driving the inputs going to, and monitoring the outputs coming from, the routing portions is by using reconfigurable logic elements, such as configurable logic blocks (CLBs) previously discussed. FIG. 12 illustrates one embodiment where a block of CLBs 820a from an interconnect board 105a is used to drive a routing portion 830a. Routing portion 830a is configured with a mapping function for inputs to outputs. Further, routing portion 830a drives a second routing portion 830b which is configured with the inverse function from the first routing portion 830a. Finally, a second block of CLBs 820b are configured to monitor the output data. In accordance with this invention, the configuration of the system is simplified since the pattern read by the monitoring block of CLBs 820b is expected to be the same as the pattern generated by the first block of CLBs 820a.

Figure 13A:
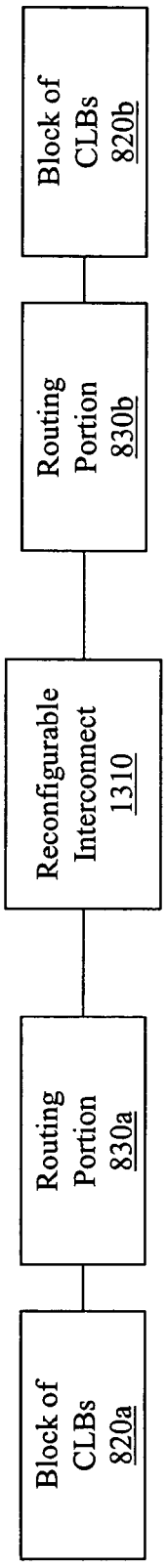
FIGS. 13A-13C illustrate other embodiments of at least one aspect of the present invention.
Figure 13B:
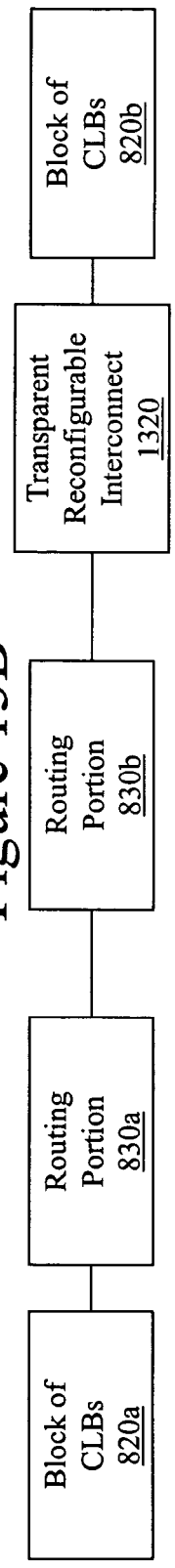
Figure 13C:
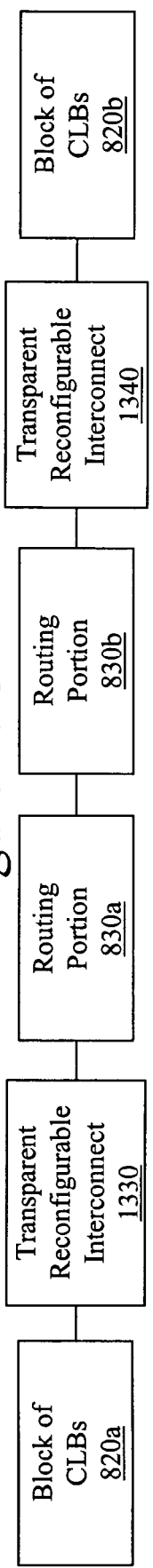

FIGS. 13A to 13C illustrate other embodiments of at least one aspect of the present invention. As shown in FIG. 13A, similar to the embodiment shown in FIG. 12, there is a first block of CLBs 820a driving the routing portion 830a and a second block of CLBs 820b to process the output from the second routing portion 830b. In this embodiment, there is a third reconfigurable interconnect 1310 coupled between the first and second routing portions 830a and 830b. In this embodiment, the third reconfigurable interconnect 1310 may be configured to be transparent in order to have no affect on the inverse transformation of the second routing portion 830b. That is, for a transparent reconfigurable interconnect, there would be a straight input to output mapping. For example, the first input is mapped to the first output, the second input is mapped to the second output, etc. It should be understood that any number of transparently configured reconfigurable interconnects can be disposed in the path between the first block of CLBs 820a and the second block of CLBs 820b. Thus, in one embodiment, as shown in FIG. 13B, transparently configured reconfigurable interconnect 1320 is disposed between the second routing portion 830b and the second block of CLBs 820b. In another embodiment, as shown in FIG. 13C, there are two transparently configured interconnects 1330 and 1340. In this embodiment there is a transparently configured reconfigurable interconnect 1330 between the first block of CLBs 820a and the routing portion 830a and a second transparently configured reconfigurable interconnect 1340 between the routing portion 830b and the second block of CLBs 820b. It should be understood by those skilled in the art that the number of additional reconfigurable interconnects, whether transparent or not, is not limited to the examples illustrated within FIGS. 13A to 13C.

One configuration in accordance with at least one aspect of an illustrative embodiment of the present invention includes interconnect board 107 configuration as shown in FIG. 8B. In this embodiment, the interconnect board 107 is configured to have one thousand fifty-six (1056) pins, eight (8) routing portions 830a to 830h each having one hundred thirty-two (132) pins, coupled to emulation board 108. Therefore, for such a configuration, twenty-four (24) CLBs from each of forty-four (44) emulation chips of emulation board 105 are employed to test routing portions. Since there are one thousand fifty-six (1056) pins to account for, the system utilizes eleven (11) bits of the sixteen (16) bits available for each of the twenty-four (24) CLBs of each of the forty-four (44) meta chips. The CLBs are programmed with a pattern and driven out in twenty-two (22) clock cycles with the output inverted for the last eleven (11) clock cycles. The pattern loading process is then repeated for all one hundred thirty-two (132) configurations of the routing portions.

Aspects of the invention has been described with respect to a reconfigurable interconnect, those of skill in the art will appreciate that the inventive principles can be used for any interconnect portion of any integrated circuit, and is not limited for use only with dedicated reconfigurable interconnects. Also, while the present invention has been described with regard to an emulation environment, it will be recognized that the present invention may be practiced in other environments that configure reconfigurable interconnects. Further, all references to bits set to zero or one are illustrative and may be reversed.

Also, while the methods and systems of the present invention have been described in terms of the above illustrated embodiments, those skilled in the art will recognize that the various aspects of the present invention can be practiced with modification and alteration within the spirit and scope of the appended claims. The description is thus to be regarded as illustrative instead of restrictive of the present invention. For example, each of the elements of the aforementioned embodiments may be utilized alone or in combination with elements of the other embodiments. There are any number of alternative combinations for defining the invention, which incorporate one or more elements from the specification, including the description, claims, and drawings, in various combinations or sub-combinations. It will be apparent to those skilled in the relevant technology, in light of the present specification, that alternate combinations of aspects of the invention, either alone or in combination with one or more elements or steps defined herein, may be utilized as modifications or alterations of the invention or as part of the invention. It is intended that the written description of the invention contained herein covers all such modifications and alterations.

We claim:

1. A method for testing configurable logic blocks in an emulation system, the method comprising steps of:

configuring a first set of configurable logic blocks to be first testing circuitry;

operating the first set to test a second set of configurable logic blocks;

configuring each configurable logic block of the second set to respond with a deterministic output to an N-bit input, wherein the configuring the first set includes configuring a configurable logic block of the first set as a verifier to verify a responsive output of a group of configurable logic blocks of the second set, wherein the verifier is configured to accept its own output and the output of the group of configurable logic blocks as an input, wherein, upon the output of the verifier being a failure indicator, the verifier is configured to maintain the failure indicator for the test.

2. The method of claim 1, further comprising steps of:

configuring the second set to be second testing circuitry; and operating the second set to test the first set.

3. The method of claim 1, further comprising steps of:
configuring a third set of configurable logic blocks to be second testing circuitry; and
operating the third set, concurrently with the first set, to test a fourth set of configurable logic blocks.

4. The method of claim 3, further comprising steps of:
configuring the second set and the fourth set to be third testing circuitry and fourth testing circuitry, respectively; and
operating the second set and the fourth set to test the first set and the third set, respectively.

5. The method of claim 1, wherein the step of configuring the first set includes:
configuring $N \geq 1$ configurable logic blocks of the first set to operate as an N-bit input generator; and
coupling an output of the N-bit input generator to the configurable logic blocks of the second set.

6. The method of claim 5, further comprising a step of configuring a configurable logic block of the first set to determine whether the N-bit input generator outputs a predetermined value.

7. The method of claim 6, wherein the step of configuring the $N \geq 1$ configurable logic blocks includes configuring the $N \geq 1$ configurable logic blocks to operate as an N-bit counter.

8. The method of claim 7, wherein the predetermined value is a maximum value of the N-bit counter.

9. The method of claim 1, wherein the input of the verifier is configured to accept N bits, wherein the group of configurable logic blocks of the second set includes N−1 configurable logic blocks, and wherein the output of the group contains N−1 bits.

10. The method of claim 1, wherein the step of configuring the verifier includes configuring the verifier to deterministically output a failure indicator.

11. A method of testing routing portions in an emulation system, the method comprising steps of:
configuring a first routing portion to map N inputs of the first routing portion to N outputs of the first routing portion in a first configuration;
configuring a second routing portion to map N inputs of the second routing portion to N outputs of the second routing portion in a second configuration inversely mapped to the first configuration, the N inputs of the second routing portion configured to be coupled to the N outputs of the first routing portion;
applying input data to the inputs of the first routing portion; and
receiving output data from the output of the second routing portion, the output data being responsive to the input data.

12. The method of claim 11, further comprising a step of determining whether a difference exists between the input data and the output data.

13. The method of claim 12, further comprising a step of configuring a second group of configurable logic blocks to perform the step of determining.

14. The method of claim 11, further comprising a step of configuring a first group of configurable logic blocks to perform the step of applying, wherein the configurable logic blocks include logic circuitry for implementing reprogrammable logic.

15. The method of claim 11, wherein the N inputs of the second routing portion are configured to be coupled to the N outputs of the first routing portion through at least one reconfigurable interconnect.

16. An integrated circuit, comprising:
a first set of configurable logic blocks;
a second set of configurable logic blocks, coupled to the first set; and
a data processing portion coupled to the first set, the data processing portion configured to provide a first test pattern to the first set,
wherein the first set is configured to provide a second test pattern to test the second set, and the second set is configured to output data in response to the second test pattern received from the first set,
wherein the first set is further configured to provide an N-bit input generator to the second set and to provide a configurable logic block, separate from the N-bit input generator, as a verifier to verify the output data of the second set.

17. The integrated circuit of claim 16, wherein the first set is further configured to compare the output data to predetermined output data.

18. The integrated circuit of claim 16, wherein the data processing portion is further configured to provide a third test pattern to the second set, the second set is further configured to provide a fourth test pattern to test the first set, and the first set is further configured to output second data in response to fourth test pattern received from the second set.

19. The integrated circuit of claim 16, wherein an output of the verifier is an input to the verifier, and wherein the output of the verifier is a failure indicator.

20. An integrated circuit, comprising:
a first routing portion configured to map N inputs of the first routing portion to N outputs of the first routing portion in a first configuration, and configured to receive input data;
a second routing portion configured to map N inputs of the second routing portion to N outputs of the second routing portion in a second configuration inversely mapped to the first configuration, and configured to output data; and
monitoring logic configured to determining whether a difference exists between the input data and the output data,
wherein the N inputs of the second routing portion are coupled to the N outputs of the first routing portion.

21. An emulation system, comprising:
a plurality of emulation boards; and
a plurality of interconnect boards interconnecting the plurality of emulation boards,
wherein each of the plurality of interconnect boards has an integrated circuit having first and second sets of configurable logic blocks and a data processing portion coupled to the first and second sets, wherein the data processing portion is configured to provide a first test pattern to the first set to test the second set and a second test pattern to the second set to test the first set.

22. An emulation system, comprising:
a plurality of emulation boards; and
a plurality of interconnect boards interconnecting the plurality of emulation boards,
wherein each of the plurality of interconnect boards has an integrated circuit having first and second routing portions and monitoring logic,
wherein the first routing portion is configured to receive input data and to map N inputs of the first routing portion to N outputs of the first routing portion in a first manner, wherein the second routing portion is configured to map N inputs of the second routing portion to N outputs of the second routing portion in a second manner inverse to the first manner, and is configured to output data, wherein the N inputs of the second routing portion are communicatively coup led to the N outputs of the first routing portion, and wherein the monitoring logic is configured to determine whether a difference exists between the input data and the output data.

* * * * *

UNITED STATES PATENT AND TRADEMARK OFFICE
CERTIFICATE OF CORRECTION

PATENT NO. : 7,587,649 B2 Page 1 of 1
APPLICATION NO. : 10/673211
DATED : September 8, 2009
INVENTOR(S) : Montagne et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 633 days.

Signed and Sealed this

Twenty-first Day of September, 2010

David J. Kappos
*Director of the United States Patent and Trademark Office*